United States Patent
Matsuyama et al.

(10) Patent No.: US 11,118,013 B2
(45) Date of Patent: Sep. 14, 2021

(54) POLYIMIDE RESIN PRECURSOR

(71) Applicant: ARISAWA MFG. CO., LTD., Niigata (JP)

(72) Inventors: Hiroyuki Matsuyama, Niigata (JP); Yoshinori Sato, Niigata (JP)

(73) Assignee: Arisawa Mfg. Co., Ltd., Niigata (JP)

( * ) Notice: Subject to any disclaimer, the term of this patent is extended or adjusted under 35 U.S.C. 154(b) by 364 days.

(21) Appl. No.: 15/417,667

(22) Filed: Jan. 27, 2017

(65) Prior Publication Data

US 2017/0210854 A1    Jul. 27, 2017

(30) Foreign Application Priority Data

Jan. 27, 2016 (JP) .............................. JP2016-013779

(51) Int. Cl.
| | | |
|---|---|---|
| *C08G 73/10* | (2006.01) | |
| *B32B 15/08* | (2006.01) | |
| *B32B 27/28* | (2006.01) | |
| *H05K 1/03* | (2006.01) | |
| *B32B 15/20* | (2006.01) | |

(52) U.S. Cl.
CPC .......... *C08G 73/1067* (2013.01); *B32B 15/08* (2013.01); *B32B 15/20* (2013.01); *B32B 27/281* (2013.01); *H05K 1/0346* (2013.01); *B32B 2457/08* (2013.01); *H05K 2201/0154* (2013.01)

(58) Field of Classification Search
CPC ............ C08G 73/1067; C08G 73/1007; C08G 73/1039; C08G 73/1064; C08G 73/1071; H05K 1/0346; H05K 2201/0154; H05K 3/022; H05K 1/032; C08J 2379/08; C08J 5/18; C08L 79/08; C08L 2201/02; C08L 2203/20; B32B 15/08; B32B 15/20; B32B 27/281; B32B 2457/08; B32B 2307/3065

See application file for complete search history.

(56) References Cited

U.S. PATENT DOCUMENTS

| | | | |
|---|---|---|---|
| 5,571,579 A | 11/1996 | Kato et al. | |
| 2006/0048963 A1 | 3/2006 | Nishinaka et al. | |
| 2006/0115670 A1 | 6/2006 | Tanaka et al. | |
| 2007/0269665 A1 | 11/2007 | Shimoohsako et al. | |
| 2009/0306329 A1* | 12/2009 | Hasegawa | C08G 73/16 528/289 |
| 2012/0029164 A1* | 2/2012 | Hasegawa | C08G 73/16 528/353 |
| 2012/0187399 A1* | 7/2012 | Fukuda | H01L 29/78603 257/43 |
| 2014/0085830 A1* | 3/2014 | Fukuda | H01L 51/529 361/720 |
| 2015/0159043 A1 | 6/2015 | Lai et al. | |

FOREIGN PATENT DOCUMENTS

| | | |
|---|---|---|
| CN | 1726259 A | 1/2006 |
| JP | 2004-189981 A | 7/2004 |
| JP | 2004-276401 A | 10/2004 |
| JP | 2005-1384 A | 1/2005 |
| JP | 2005-146287 A | 6/2005 |
| JP | 2006-306990 A | 11/2006 |
| JP | 4749900 B2 | 8/2011 |
| JP | 5090653 B2 | 12/2012 |
| JP | 2015-110332 A | 6/2015 |
| JP | 2015-127370 A | 7/2015 |
| WO | 2004/050352 A1 | 6/2004 |
| WO | WO-2014046180 A1 * | 3/2014 ......... C08G 73/1039 |

OTHER PUBLICATIONS

Ando et al., "Low-thermal expansion, low hygroscopic expansion and heat resistant insulating material: Polyesterimides", The Newest Polyimides—Fundamentals and Applications, Aug. 25, 2010, pp. 295 to 304, NTS Inc., Tokyo Japan, for which a partial translation is attached.

* cited by examiner

*Primary Examiner* — John D Freeman
(74) *Attorney, Agent, or Firm* — Wolf, Greenfield & Sacks, P.C.

(57) ABSTRACT

The polyimide resin precursor in the present embodiment is a polyimide resin precursor obtained by allowing a diamine component and a tetracarboxylic acid anhydride component to react with each other, wherein based on the whole of the diamine component, the content of p-phenylenediamine is 75 mol % or more; the tetracarboxylic acid anhydride component includes an ester-containing tetracarboxylic acid anhydride represented by formula (1), and at least one biphenyltetracarboxylic acid anhydride selected from the group consisting of 3,4,3',4'-biphenyltetracarboxylic acid dianhydride, 2,3,3',4'-biphenyltetracarboxylic acid dianhydride and 2,3,2',3'-biphenyltetracarboxylic acid dianhydride; and based on the whole of the tetracarboxylic acid anhydride component, (i) the total of the content of the ester-containing tetracarboxylic acid anhydride and the content of the biphenyltetracarboxylic acid anhydride is 75 mol % or more, and (ii) the content of the ester-containing tetracarboxylic acid anhydride is 15 to 80 mol %, and the content of the biphenyltetracarboxylic acid anhydride is 85 to 20 mol %.

5 Claims, No Drawings

POLYIMIDE RESIN PRECURSOR

RELATED APPLICATIONS

The present application claims priority to Japanese Application Number 2016-013779, filed Jan. 27, 2016, the disclosure of which is hereby incorporated by reference herein in its entirety.

BACKGROUND

Field

The present invention relates to a polyimide resin precursor.

Description of the Related Art

Various engineering plastics are used in the field of electronic materials. Among such engineering plastics, polyimide resin is excellent in heat resistance, mechanical properties and electric insulation, and accordingly is widely used in insulating layers of flexible circuit boards. Flexible circuit boards can be made thin and are excellent in flexibility, accordingly are used in electric devices such as cellular phones and hard disks, and significantly contribute to miniaturization and weight saving of electronic devices.

Recently, high functionalization of electronic devices has been advanced, thus more electric signals are required to be transmitted, and the suppression of transmission loss has been investigated. As one of such investigations, an adaptation to high frequencies based on achievement of low-dielectric flexible circuit boards has been advanced. The polyimide resins used in flexible circuit boards cannot be said to be satisfactory with respect to the dielectric properties such as dielectric constant and dielectric tangent, accordingly undergo large transmission loss, and hardly applicable to high-frequency-adaptable devices.

Polyimide resins include imide skeletons, polar groups, accordingly are high in the water absorption rate, and liable to be affected by the use environments of electronic devices. In other words, in a high humidity environment, there are concerns that the transmission loss may be further degraded due to the effect of the moisture absorption in the polyimide resin layer. Accordingly, in the portions needing low transmission loss, liquid crystal polymers (LCPs) excellent in dielectric properties and water absorption rate are used; however, such liquid crystal polymers have drawbacks that the adhesiveness to metal foils such as copper foil and the heat resistance are low. Under such circumstances, further investigations of polyimide resins exhibiting low dielectric properties are being advanced.

Patent Literature 1 and Patent Literature 2 disclose polyimide resin layers including pyromellitic acid dianhydride, as a tetracarboxylic acid dianhydride, in a content of 50 mol % or more; in Examples, polyimide resins including pyromellitic acid and 1,4-phenylene bis(anhydrous trimellitate) are obtained.

Patent Literature 3 discloses a polyimide resin using, as a diamine component, a dimer acid-type diamine and an aromatic diamine, and a resin composition including a metal salt of an organic phosphine acid; the resin composition is disclosed to have a low dielectric constant and a low dielectric tangent.

Patent Literature 4 discloses that a multiple layer polyimide film having polyimide layers including fluorine-containing polymer particles has a low dielectric constant.

Non Patent Literature 1 discloses that a polyimide resin obtained from an ester-containing tetracarboxylic acid (TAHQ) and a diamine component (p-phenylenediamine) has a low CTE (3.2 ppm/K), and further discloses that a polyimide resin obtained from TAHQ and an ester-containing diamine (BPTP) has a low dielectric constant and a low dielectric tangent.

CITATION LIST

Patent Literature 1: Japanese Patent No. 4749900
Patent Literature 2: Japanese Patent No. 5090653
Patent Literature 3: Japanese Patent Laid-Open No. 2015-127370
Patent Literature 4: Japanese Patent Laid-Open No. 2015-110332 Non Patent Literature 1: The Newest Polyimides—Fundamentals and Applications—, pp. 295 to 304.

SUMMARY

Technical Problem

However, in Patent Literature 1 and Patent Literature 2, the polyimide group concentrations in the polyimide resins are high because the polyimides each include pyromellitic acid dianhydride, as a tetracarboxylic acid dianhydride, in a content of 50 mol % or more, and there is a problem that the dielectric properties and the water absorption rate are degraded.

In Patent Literature 3, the flame retardancy is imparted by including a metal salt of an organic phosphine acid, and hence the polyimide resin alone does not exhibit flame retardancy. The addition of the metal salt of an organic phosphine acid increases the linear expansion coefficient (CTE), and accordingly, when a metal laminated plate (CCL) is prepared by using the polyimide resin, the possibility of the occurrence of the warping due to the CTE difference of the metal foil (such as a copper foil) is enhanced.

The fluorine-containing polymer particles of Patent Literature 4 themselves are high in hydrophobicity, low in the dispersibility in the polar solvent (amide-based solvents such as N,N-dimethylacetamide or N-methyl-2-pyrrolidone) used in the polyimide resin precursor solution, accordingly, cannot achieve a satisfactory dispersion state only by being added under stirring to the polyimide resin precursor solution to form aggregates of the particles, and makes it difficult to obtain a polyimide resin layer having surface smoothness and being uniform in thickness. The fluorine-containing polymers typified by polytetrafluoroethylene (PTFE) are known to be low in adhesiveness, the adhesiveness between the polyimide resin and fluorine-containing polymer particles is low, and there is a possibility that fine cracks are generated in the interface between the resin and the particles due to the volume shrinkage during the imidization reaction. Moreover, when fluorine-containing polymers are discarded, combustion of the fluorine-containing polymer is known to generate hydrofluoric acid, and hence fluorine-containing polymers imposes a heavy load on the environment and the human body.

A polyimide resin described in Non Patent Literature 1, obtained from TAHQ and p-phenylenediamine has a high water absorption rate, but in the foregoing literature, no description is found on the dielectric properties. Moreover, the polyimide resin obtained from TAHQ and an ester-containing diamine (BPTP) has the drawbacks that the price of the diamine component is high and the film properties such as ductility are low.

In view of the above-described circumstances, an object of the present invention is to provide a polyimide resin precursor actualizing a polyimide resin being low in dielectric constant and dielectric tangent, exhibiting a low linear expansion coefficient and a low water absorption rate, and further having an excellent flame retardancy.

Solution to Problem

The present inventors made a diligent study in order to solve the above-described technical problem, and consequently have perfected the present invention by discovering that the above-described technical problem can be solved by a polyimide resin precursor including a specific diamine component and a specific tetracarboxylic acid anhydride component, in specific proportions.

Specifically, the present invention is as follows.

[1]

A polyimide resin precursor obtained by allowing a diamine component and a tetracarboxylic acid anhydride component to react with each other, wherein based on the whole of the diamine component, the content of p-phenylenediamine is 75 mol % or more;

the tetracarboxylic acid anhydride component includes an ester-containing tetracarboxylic acid anhydride represented by the following formula (1), and (1)

[Structure of formula (1)]

(In the formula, R represents a divalent organic group.), at least one biphenyltetracarboxylic acid anhydride selected from the group consisting of 3,4,3',4'-biphenyltetracarboxylic acid dianhydride, 2,3,3',4'-biphenyltetracarboxylic acid dianhydride and 2,3,2',3'-biphenyltetracarboxylic acid dianhydride; and based on the whole of the tetracarboxylic acid anhydride component, (i) the total of the content of the ester-containing tetracarboxylic acid anhydride and the content of the biphenyltetracarboxylic acid anhydride is 75 mol % or more, and (ii) the content of the ester-containing tetracarboxylic acid anhydride is 15 to 80 mol %, and the content of the biphenyltetracarboxylic acid anhydride is 85 to 20 mol %.

[2]

The polyimide resin precursor according to [1], wherein the diamine component further includes at least one selected from the group consisting of 2,2'-dimethyl-4,4'-diaminobiphenyl, 2,2'-bis(trifluoromethyl)benzidine, 1,3-bis(3-aminophenoxy)benzene, 1,4-bis(3-aminophenoxy)benzene, 4,4'-diaminodiphenyl ether, 3,4'-diaminodiphenyl ether and 2,2-bis(4-aminophenoxyphenyl) propane.

[3]

The polyimide resin precursor according to [1] or [2], wherein R in the formula (1) is any one selected from the group consisting of the structures represented by the following formula (2):

(2)

[Structure of formula (2)]

(In the formula, n represents an integer of 1 to 5.)

[4]

The polyimide resin precursor according to any one of [1] to [3], wherein the tetracarboxylic acid anhydride component further includes at least one selected from the group consisting of pyromellitic acid dianhydride, 3,3',4,4'-benzophenone tetracarboxylic acid dianhydride, 4,4'-oxydiphthalic acid anhydride and 3,3',4,4'-diphenyl sulfone tetracarboxylic acid dianhydride.

[5]

A polyimide resin obtained by curing the polyimide resin precursor according to any one of [1] to [4].

[6]

A metal clad laminate wherein the polyimide resin according to [5] is laminated on a metal foil.

[7]

A flexible printed wiring board formed by using the metal clad laminate according to [6].

Advantageous Effects of Invention

According to the present invention, it is possible to actualize a polyimide resin being low in dielectric constant and dielectric tangent, exhibiting a low linear expansion coefficient and a low water absorption rate, and further having an excellent flame retardancy.

DETAILED DESCRIPTION OF THE PREFERRED EMBODIMENTS

Hereinafter, the modes for carrying out the present invention (hereinafter, referred to as the "present embodiments") are described in detail. It is to be noted that the present invention is not limited by the following embodiments, and can be implemented in various modifications within the scope of the gist of the present invention.

[Polyimide Resin Precursor]

The polyimide resin precursor in the present embodiment is a polyimide resin precursor obtained by allowing a diamine component and a tetracarboxylic acid anhydride component to react with each other, wherein based on the whole of the diamine component, the content of p-phenylenediamine is 75 mol % or more;

the tetracarboxylic acid anhydride component includes an ester-containing tetracarboxylic acid anhydride represented by formula (1), and at least one biphenyltetracarboxylic acid anhydride selected from the group consisting of 3,4,3',4'-biphenyltetracarboxylic acid dianhydride, 2,3,3',4'-biphenyltetracarboxylic acid dianhydride and 2,3,2',3'-biphenyltetracarboxylic acid dianhydride; and based on the whole of the tetracarboxylic acid anhydride component, (i) the total of the content of the ester-containing tetracarboxylic acid anhydride and the content of the biphenyltetracarboxylic acid anhydride is 75 mol % or more, and (ii) the content of the ester-containing tetracarboxylic acid anhydride is 15 to 80 mol %, and the content of the biphenyltetracarboxylic acid anhydride is 85 to 20 mol %.

Here, a polyimide resin precursor means a precursor giving a polyimide resin by curing, and is generally also referred to a polyamic acid.

As the diamine component, p-phenylenediamine is included in a content of 75 mol % or more based on the whole of the diamine component. When the content of p-phenylenediamine is less than 75 mol %, the dielectric tangent and the CTE tend to be degraded. From the viewpoint of achieving a low CTE, the content of p-phenylenediamine is preferably 80 mol % or more, more preferably 85 mol % or more and furthermore preferably 90 mol % or more.

As the diamine component, in addition to p-phenylenediamine, other diamine components may also be included. Examples of the other diamine components include, without being particularly limited to: m-phenylenediamine, 2,4-diaminotoluene, 4,4'-diaminobiphenyl, 4,4'-diamino-2,2'-bis(trifluoromethyl)biphenyl, 3,3'-diaminodiphenyl sulfone, 4,4'-diaminodiphenyl sulfone, 4,4'-diaminodiphenyl sulfide, 4,4'-diaminodiphenylmethane, 4,4'-diaminodiphenyl ether, 3,4'-diaminodiphenyl ether, 3,3'-diaminodiphenyl ether, 1,4-bis(4-aminophenoxy)benzene, 1,3-bis(4-aminophenoxy)benzene, 1,3-bis(3-aminophenoxy)benzene, 4,4'-bis(4-aminophenoxy)biphenyl, bis[4-(4-aminophenoxy)phenyl]sulfone, bis[4-(3-aminophenoxy)phenyl]sulfone, 2,2-bis[4-(4-aminophenoxy)phenyl]propane and 2,2-bis[4-(4-aminophenoxy)phenyl]hexafluoropropane.

Among the foregoing, from the viewpoint of the price and easy availability, it is preferable to include at least one or more selected from the group consisting of 2,2'-dimethyl-4,4'-diaminobiphenyl, 2,2'-bis(trifluoromethyl)benzidine, 1,3-bis(3-aminophenoxy)benzene, 1,4-bis(3-aminophenoxy)benzene, 4,4'-diaminodiphenyl ether, 3,4'-diaminodiphenyl ether and 2,2-bis[4-(4-aminophenoxyphenyl)propane. Moreover, from the viewpoint of achieving a low CTE, it is more preferable to include at least one or more selected from the group consisting of 2,2'-dimethyl-4,4'-diaminobiphenyl and 2,2'-bis(trifluoromethyl)benzidine, and from the viewpoint of achieving a low dielectric property, it is more preferable to include at least one or more selected from the group consisting of 2,2'-bis(trifluoromethyl)benzidine, 4,4'-diaminodiphenyl ether and 1,3-bis(4-aminophenoxy)benzene.

The above-described diamine compounds may also be used each alone or in combinations of two or more thereof.

The ester-containing tetracarboxylic acid anhydride is represented by the following formula (1).

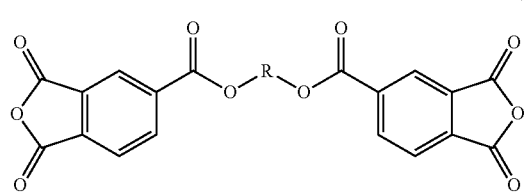

(1)

(In the formula, R represents a divalent organic group.)

Here, R represents a divalent organic group, and may be either an aromatic structure or an alicyclic structure; examples of R include any one selected from the group consisting of the structures represented by the following formula (2).

(2)

In the formula, n represents an integer of 1 to 5.

From the viewpoint of achieving a low CTE and flame retardancy, R is preferably an organic group represented by any one of the following structures.

(3)

The biphenyltetracarboxylic acid anhydride is at least one or more selected from the group consisting of 3,4,3',4'-biphenyltetracarboxylic acid dianhydride, 2,3,3',4'-biphenyltetracarboxylic acid dianhydride and 2,3,2',3'-biphenyltetracarboxylic acid dianhydride; from the viewpoint of easy availability and achieving a low CTE, preferable among these is 3,4,3',4'-biphenyltetracarboxylic acid dianhydride.

The tetracarboxylic acid anhydride component may also include other tetracarboxylic acid anhydrides in addition to the ester-containing tetracarboxylic acid anhydride and the biphenyltetracarboxylic acid anhydride. Examples of the other tetracarboxylic acid anhydrides include, without being particularly limited to: pyromellitic acid dianhydride, 3,3',4,4'-benzophenone tetracarboxylic acid dianhydride, 4,4'-oxydiphthalic acid anhydride and 3,3',4,4'-diphenyl sulfone tetracarboxylic acid dianhydride. Among the foregoing, from the viewpoint of the price and easy availability, pyromellitic acid dianhydride is preferable.

In the present embodiment, based on the whole of the tetracarboxylic acid anhydride, (i) the total of the content of the ester-containing tetracarboxylic acid anhydride and the content of the biphenyltetracarboxylic acid anhydride is 75 mol % or more, and (ii) the content of the ester-containing tetracarboxylic acid anhydride is 15 to 80 mol %, and the content of the biphenyltetracarboxylic acid anhydride is 85 to 20 mol %. By satisfying the foregoing (i) and (ii), it is possible to obtain the effect of lowering the dielectric tangent regarded as significantly affecting the transmission loss. The involved mechanism of action is not clear; however, the ester-containing tetracarboxylic acid anhydride is larger in molecular weight than common aromatic tetracarboxylic acid anhydrides, and accordingly, the concentration of the imide group, a polar group in the polyimide molecule, is decreased. Consequently, the charge in the polyimide molecule is reduced, and moreover, the ester group reduces the charge migration in the polyimide molecule; thus, excellent dielectric properties are considered to be obtained. Additionally, the inclusion of the biphenyltetracarboxylic acid anhydride in a specific proportion based on the ester-containing tetracarboxylic acid anhydride reduces the intermolecular packing property and suppresses the intermolecular charge migration, and thus, the dielectric properties are inferred to further improved.

It is to be noted that in the present specification, the descriptions of the mechanism of action are all based on the inferences, and the mechanism of action is not limited to the contents of the descriptions.

The total of the content of the ester-containing tetracarboxylic acid anhydride and the content of the biphenyltetracarboxylic acid anhydride is preferably 80 mol % or more, more preferably 85 mol % or more and furthermore preferably 90 mol % or more.

The content of the ester-containing tetracarboxylic acid anhydride is preferably 20 to 80 mol % and more preferably 30 to 60 mol %.

The content of the biphenyltetracarboxylic acid anhydride is preferably 80 to 30 mol % and more preferably 70 to 40 mol %.

[Method for Producing Polyimide Resin Precursor]

The polyimide resin precursor in the present embodiment can be obtained by performing the polycondensation of a diamine component and a tetracarboxylic acid anhydride component on the basis of a heretofore known method. For example, the diamine component is added to a solvent and then dissolved in the solvent at room temperature to 30° C., the tetracarboxylic acid anhydride component is gradually added to the resulting solution and stirred at room temperature for 0.5 hour or more, and thus, a polyimide resin precursor can be obtained. In this case, the tetracarboxylic acid dianhydride component may also be added to the diamine component in a dispersed state without dissolving the diamine component, or alternatively, the diamine component may be added, after the tetracarboxylic acid dianhydride is added to the solvent, in a state of the tetracarboxylic acid dianhydride being dissolved or dispersed. Subsequently, the resulting mixture is stirred at room temperature for 0.5 hour or more, and thus, a polyimide resin precursor can be obtained. Alternatively, also when the stirring temperature falls within a range from −10° C. to the boiling point of the solvent and the stirring time is 0.5 hour or more, the polyimide resin precursor of the present embodiment can be obtained.

[Polyimide Resin Precursor Solution]

The polyimide resin precursor in the present embodiment is usually used as a polyimide resin precursor solution (hereinafter, also simply referred to as the "precursor solution") prepared by dissolving the polyimide resin precursor in a solvent. Here, the solvent is not particularly limited as long as the solvent dissolves the resin precursor; examples of the solvent include: an aprotic polar compound, an ether-based compound, a water-soluble alcohol-based compound, a non-water-soluble alcohol-based compound and a ketone-based compound.

Specific examples of the aprotic polar compound include: N-methylpyrrolidone, N,N-dimethylformamide, N,N-dimethylacetamide, dimethyl sulfoxide and hexamethylphosphoramide; specific examples of the ether-based compound include 2-methoxyethanol, 2-ethoxyethanol, 2-(methoxymethoxy)ethoxyethanol, 2-isopropoxyethanol, 2-butoxyethanol, tetrahydrofurfuryl alcohol, diethylene glycol, diethylene glycol monomethyl ether, diethylene glycol monoethyl ether, diethylene glycol monobutyl ether, triethylene glycol, triethylene glycol monoethyl ether, tetraethylene glycol, 1-methoxy-2-propanol, 1-ethoxy-2-propanol, dipropylene glycol, dipropylene glycol monomethyl ether, dipropylene glycol monoethyl ether, tripropylene glycol monomethyl ether, polyethylene glycol, polypropylene glycol, tetrahydrofuran, dioxane, 1,2-dimethoxyethane, diethylene glycol dimethyl ether and diethylene glycol diethyl ether; specific examples of the water-soluble alcohol-based compound include: methanol, ethanol, 1-propanol, 2-propanol, tert-butyl alcohol, ethylene glycol, 1,2-propanediol, 1,3-propanediol, 1,3-butanediol, 1,4-butanediol, 2,3-butanediol, 1,5-pentanediol, 2-butene-1,4-diol, 2-methyl-2,4-pentanediol, 1,2,6-hexanetriol and diacetone alcohol; specific examples of the non-water-soluble alcohol-based compound include: benzyl alcohol; and specific examples of the ketone-based compound include: 1,5,5-trimethyl-3-cyclohexanone. Moreover, examples of the other solvents include γ-butyrolactone. The foregoing solvents may be used each alone or in combinations of two or more thereof.

Among the foregoing, examples of a particularly preferable solvent include: single solvents such as N-methylpyrrolidone, N,N-dimethylformamide, N,N-dimethylacetamide and diethylene glycol monomethyl ether; and mixed solvents such as a combination of N-methylpyrrolidone and diethylene glycol monomethyl ether, a combination of N-methylpyrrolidone and methanol and a combination of N-methylpyrrolidone and 2-methoxyethanol.

The content of the solvent is preferably 70 to 90 mass % based on the resin component including the resin precursor. The content of the solvent set to be 70 to 90 mass % allows the varnish viscosity excellent in applicability to be achieved.

From the viewpoint of workability, the solid content concentration of the precursor solution is preferably 10 to 30 mass %, more preferably 15 to 30 mass % and furthermore preferably 20 to 30 mass %. When the solid content concentration is less than 10 mass %, the drying shrinkage during the polyimide resin coating film formation comes to be large, accordingly the workability (productivity) tends to be degraded; when the solid content concentration exceeds 30 mass %, the viscosity of the solution is increased excessively and the workability tends to be degraded.

The viscosity of the precursor solution is preferably 1000 to 50000 cP, more preferably 2000 to 30000 cP and furthermore preferably 2000 to 20000 cP. When the viscosity is less than 1000 cP, the productivity of the polyimide resin coating film tends to be degraded, and when the viscosity exceeds 50000 cP, the workability tends to be degraded.

The precursor solution may include heretofore known additives. Examples of such additives include: imidization promoters typified by tertiary amines such as pyridine, acid anhydrides such as acetic acid anhydride; and leveling agents such as surfactants. In order to obtain better flame retardancy, a flame retardant may be mixed in the precursor solution of the present embodiment. Examples of the flame retardant include: inorganic fillers such as aluminum hydroxide, silica and barium sulfate; or organophosphorus compounds such as phosphoric acid esters. Moreover, in order to obtain satisfactory slipping property, a slipping agent such as an inorganic filler may be mixed in the precursor solution of the present embodiment. Examples of the inorganic filler include: silica, talc and calcium phosphate. These may be used each alone or in combinations.

[Polyimide Resin Coating Film]

By curing the polyimide resin precursor solution in the present embodiment, a polyimide resin coating film can be obtained. Specifically, a polyimide resin coating film can be obtained by applying the polyimide resin precursor solution, for example, on a substrate made of copper, aluminum or glass, and by heating the applied polyimide resin precursor solution to be imidized. The imidization temperature is 200° C. or higher, preferably 250° C. or higher and more preferably 300° C. or higher, and the heating is performed for 5 minutes or more and preferably for 30 minutes or more. The polyimide resin coating film may be used, depending on the use thereof, as a polyimide coating closely attached to the substrate, or as a polyimide film detached from the substrate.

When a polyimide film is formed from the polyimide resin precursor solution, the polyimide resin precursor solution is extruded from a slit-shaped nozzle to form a polyimide film, or the polyimide resin precursor solution is applied to a substrate by using a bar coater or the like and dried to remove the solvent, then subjected to imidization, the resulting film is detached from the substrate, and thus a polyimide film can be produced. When a polyimide coating is obtained, a polyimide resin precursor solution is applied on a substrate by a heretofore known method such as a spin coating method, a spray coating method, or a dipping method, and dried to remove the solvent, and then subjected to imidization.

The polyimide resin precursor solution in the present embodiment and the film or coating obtained from the polyimide resin precursor solution are used for the production of, for example, the following: films for FPC (flexible printed board), heat-resistant insulating tapes, heat-resistant adhesive tapes, high-density magnetic recording bases and capacitors; molding materials and molded articles such as sliding members filled with a fluororesin or graphite, structural members reinforced with glass fiber or carbon fiber, bobbins for small coils, sleeves and terminal insulating tubes; laminated materials such as insulating spacers of power transistors, magnetic head spacers, spacers of power relays and spacers of transformers; enamel coating materials for electric wire/cable insulating coating films, solar cells, low-temperature storage tanks, cosmic heat insulating materials, integrated circuits and slot liners; ultrafiltration membranes, reverse osmosis membranes and gas separation membranes; and heat resistant yarns, woven fabrics, and non-woven fabrics.

[Metal Clad Laminate]

The metal clad laminate in the present embodiment is prepared by laminating, on a metal foil, a polyimide resin coating film obtained by curing the polyimide resin precursor solution.

The metal clad laminate may be either a three-layer flexible metal laminated plate constituted with a metal foil, a polyimide resin layer and an adhesive layer or a two-layer flexible metal laminated plate constituted with a metal foil and a polyimide resin layer; however, from the viewpoint of heat resistance, dimensional stability and weight saving, the metal clad laminate is preferably a two-layer flexible metal laminated plate.

Examples of the metal foil include a copper foil, a SUS foil and an aluminum foil; however, from the viewpoint of conductivity and circuit processability, a copper foil is preferable. When a metal foil is used, the metal foil may be subjected to an inorganic surface treatment such as zinc plating or chromium plating or an organic surface treatment with an agent such as a silane coupling agent.

The two-layer flexible metal laminated plate of the present embodiment is prepared by, for example, a method including a step of applying the polyimide resin precursor solution to a metal foil, a step of drying the polyimide resin precursor solution applied to the metal foil, and a step of obtaining a polyimide resin layer by increasing the temperature up to 330 to 400° C.

In the application step, the thickness of the coating layer formed on the metal foil is varied depending on the intended use, and is appropriately set between 2 to 150 μm. According to the coating thickness, the application method can appropriately adopt a coater such as a comma coater, a die coater or a gravure coater.

The step of drying the polyimide resin precursor solution applied to the metal foil is performed at a temperature falling within a range from 80 to 150° C. and performs the drying preferably by appropriately setting the time according to the set temperature. The content of the residual solvent after the applying-drying step is preferably 50 mass % or less in 100 mass % of the solvent-containing resin component.

A metal clad laminate can also be prepared by the following separate formation method.

First, after an applied layer is formed by applying the polyimide resin precursor solution to a release film such as a PET (polyethylene terephthalate) film, a PP (polypropylene) film or a PE (polyethylene) film, the applied layer is cured and dried until the semi-cured state (hereinafter, also referred to as the stage B) is achieved, under the predetermined curing-drying conditions (temperature: 80 to 160° C., time: 1 to 30 minutes), and thus a polyimide resin layer is obtained. By applying a release treatment to the surface of the release film, the detachability with the polyimide resin layer can be improved.

Next, the resin surface of the polyimide resin layer and the rough surface of the metal foil are laminated on each other to prepare a metal clad laminate. The lamination method can use a press method, or a lamination method using a heat roll. The lamination conditions are such that the lamination is preferably performed at a temperature falling within a range from 200 to 350° C. and a pressure falling within a range from 0.5 to 5 MPa.

In the above description, a single-sided metal clad laminate is described; however, a double-sided metal clad laminate provided with metal foils on both surface of the polyimide resin layer can also be applied. The double-sided metal clad laminate can be prepared, for example, by providing a metal foil on each of both surfaces of the resin sheet prepared by the above-described separate formation method, and by subsequently thermocompression bonding the metal foils by the above-described lamination method.

A flexible printed wiring board can be obtained by covering, with a coverlay for covering a metal foil circuit, an etched surface obtained by etching the metal layer of the metal clad laminate of the present embodiment into a predetermined shape. The coverlay is not limited as long as the coverlay covers the metal foil circuit; examples of the coverlay include a coverlay prepared by applying an adhesive to a film of a resin such as polyimide, a liquid resist and a dry film resist.

The polyimide resin layer included in the metal clad laminate is excellent in dielectric properties, and in particular, has a low value for the dielectric tangent significantly affecting the transmission loss. The dielectric tangent of the polyimide resin layer is preferably 0.0040 or less and more preferably 0.0035 or less. The dielectric tangent after water absorption is preferably 0.0070 or less and more preferably 0.005 or less.

The dielectric constant of the polyimide resin layer is preferably 3.7 or less and more preferably 3.6 or less and furthermore preferably 3.5 or less. The dielectric constant after water absorption is preferably 3.7 or less and more preferably 3.6 or less.

The polyimide resin layer has a low linear thermal expansion coefficient (CTE). This is probably because the ester bond included in the ester-containing tetracarboxylic acid anhydride has a molecular orientation property, and accordingly, the polyimide molecules are oriented during the heating step in the imidization so as to lower CTE. The CTE of the polyimide resin layer is preferably 24 ppm/K or less and more preferably 20 ppm/K or less. When the CTE of the polyimide resin layer exceeds 24 ppm/K, warping tends to occur.

The water absorption rate of the polyimide resin layer is preferably 1.2 wt % or less and more preferably 1.0 wt % or less. When the water absorption rate exceeds 1.2 wt %, the effect of the moisture absorption on the polyimide resin layer comes to be significant in a high humidity environment, and the transmission loss tends to be degraded.

Moreover, the polyimide resin layer has excellent flame retardancy. This is probably because the polyimide resin is polymerized by using the monomers having an aromatic skeleton for both of the diamine component and the tetracarboxylic acid anhydride component, and accordingly the compatibility between dielectric properties and flame retardancy is made possible.

It is to be noted that the physical properties in the present specification can be measured according to the methods described in following Examples unless otherwise specified.

[Flexible Printed Wiring Board]

The flexible printed wiring boards in the present embodiment are each prepared by providing a coverlay on a metal foil with circuits formed thereon by etching the metal layer of a metal clad laminate into a predetermined shape. For the flexible printed wiring boards, the thickness values thereof can be optionally set according to the use thereof. The flexible printed wiring boards are suitably applied, for example, as chip on flexible printed wiring boards for mounting IC chips.

EXAMPLES

Hereinafter, the present invention is described more specifically by way of Examples and Comparative Examples, but the present invention is not limited only to these Examples.

The diamine components, the acid anhydride components and the solvents used in Examples and Comparative Examples are as follows.
(Diamine Components)
p-PDA: p-Phenylenediamine
TFMB: 2,2'-Bis(trifluoromethyl)benzidine
TPE-R: 1,3-bis(4-aminophenoxy)benzene
ODA: 4,4'-Diaminodiphenyl ether
BAPP: 2,2-Bis(4-aminophenoxyphenyl)propane
(Ester-Containing Tetracarboxylic Acid Anhydride)
TAHQ: p-Phenylene bis(trimellitate anhydride)
(Biphenyltetracarboxylic Acid Anhydride)
s-BPDA: 3,4,3',4'-Biphenyltetracarboxylic acid dianhydride
(Other Acid Anhydride)
PMDA: Pyromellitic acid dianhydride
(Solvent)
DMAc: N,N-Dimethyl acetamide The evaluation methods and the measurement methods in Examples and Comparative are as follows. In each of the evaluations, the average value of n (the number of the samples)=3 to 5 was adopted.

[Dielectric Constant and Dielectric Tangent (Normal State), Test with n=5]

Each sample was prepared by completely removing, by etching, the copper foil of a two-layer flexible metal laminated plate, and by allowing the thus treated laminated plate to stand still for 24 hr in an atmosphere of 23° C. and 50% RH; each sample was measured in an atmosphere of 23° C., by using an apparatus (trade name: Network Analyzer N5230A, manufactured by Aligent Technologies, Inc.), on the basis of the SPDR method (resonator method) under a condition of a frequency of 5 GHz.

The results thus obtained were evaluated as follows.
<Dielectric Constant (Normal State)>
Δ: 3.9 or more
○: 3.5 or more and less than 3.9
◎: less than 3.5
<Dielectric Tangent (Normal State)>
X: Normal state, 0.004 or more
○: Normal state, 0.003 or more and less than 0.004
◎: Normal state, less than 0.003

[Dielectric Constant and Dielectric Tangent (after Water Absorption), Test with n=5]

Each sample was prepared by completely removing, by etching, the copper foil of a two-layer flexible metal laminated plate, and by being immersed in pure water at 23° C. for 24 hr; each sample was taken out from the water, and immediately after the excess water on the surface of each sample was wiped off, each sample was measured in an atmosphere at 23° C., by using an apparatus (trade name: Network Analyzer N5230A, manufactured by Aligent Technologies, Inc.), on the basis of the SPDR method (resonator method) under a condition of a frequency of 5 GHz.

[CTE (Linear Expansion Coefficient). Test with n=1]

A sample was prepared by completely removing, by etching, the copper foil of a two-layer flexible metal laminated plate, and by allowing the thus treated laminated plate to stand still for 24 hr in an atmosphere of 23° C. and 50% RH; the sample was cut to 5 mm in width and 15 mm in length, and the dimension change of the resulting sample was measured over a temperature range from 100° C. to 200° C., by using a thermomechanical analyzer TMA-60 manufactured by Shimadzu Corp., when the sample was heated under a load of 5 g, at a programmed temperature increase rate of 10° C./min.

The results thus obtained were evaluated as follows.
X: 24 ppm/K or more
○: 18 ppm/K or more and less than 24 ppm/K
◎: less than 18 ppm/K

[Water Absorption Rate, Test with n=3]

Each sample was prepared by completely removing, by etching, the copper foil of a two-layer flexible metal laminated plate; the resulting each sample was dried under the conditions of 105° C. and 0.5 hour; the mass of each sample after cooling down to room temperature was taken as the initial value (m0). Next, after each sample was immersed in pure water at 23° C. for 24 hours, each sample was taken out from the water, and after the excess water on the surface of each sample was wiped off, the mass (md) of each sample was measured; the water absorption rate was determined from the change of the mass from the initial mass value to the mass after immersion in water, by using the following formula.

(md−m0)×100/m0=water absorption rate (%)

The results thus obtained were evaluated as follows.
X: 1.2 wt % or more
◯: 1.0 wt % or more and less than 1.2 wt %
◉: less than 1.0 wt %
[Flame Retardancy, Test with n=5]

Each sample was prepared by completely removing, by etching, the copper foil of a two-layer flexible metal laminated plate, and by allowing the thus treated laminated plate to stand still in an atmosphere of 23° C. and 50% RH; the resulting each sample was cut to 13 mm in width and 125 mm in length, and the flammability test was performed for each sample according to the UL-94 standard; the case where the V-O standard was satisfied was marked with "◯."

Example 1

In a reaction vessel, 85 g of DMAc was placed, and 2.2892 g (0.02117 mol) of p-PDA, 1.5366 g (0.00480 mol) of TFMB and 0.6601 g (0.00226 mol) of TRE-R were added, and then p-PDA, TFMB and TPE-R were dissolved in DMAc by stirring the resulting mixture at room temperature. To the obtained solution, 6.4036 g (0.01397 mol) of TAHQ and 4.1106 g (0.01397 mol) of s-BPDA were gradually added. Subsequently, the resulting solution was stirred at room temperature for 3 hours, and thus a polyimide resin precursor (polyamic acid solution) was obtained.

The obtained polyamic acid solution was applied to the roughened surface (surface roughness Rz=1.8 μm) of the electrolytic copper foil by using a bar coater so as for the thickness of the resin layer after imidization to be 25 μm, and dried at 130° C. for 10 minutes.

The copper foil with the polyamic acid solution applied thereto and dried was cooled down to room temperature, and then heated in a step-by-step manner up to 360° C. (the object temperature). The thus treated cooper foil was maintained at 360° C. for 2 hours, and then spontaneously cooled down to room temperature, and thus a two-layer flexible metal laminated plate was obtained.

Examples 2 to 11 and Comparative Examples 1 to 20

In each of Examples 2 to 11 and Comparative Examples 1 to 20, a polyimide resin precursor and a two-layer flexible metal laminated plate were prepared in the same manner as in Example 1 except that the proportions of the diamine components and the proportions of the acid anhydride components were altered as shown in Tables 1 to 3.

In each of the tables, the contents of the respective diamine components are shown in terms of mol % based on 100 mol % of the total amount of the diamine components, and the contents of the respective acid anhydride components are shown in terms of mol % based on 100 mol % of the total amount of the acid anhydride components.

TABLE 1

| Names of components | | | Example 1 | Example 2 | Example 3 | Example 4 | Example 5 | Example 6 |
|---|---|---|---|---|---|---|---|---|
| Diamines mol % | p-PDA | | 75 | 84 | 86 | 86 | 86 | 86 |
| | TFMB | | 17 | | | | | |
| | TPE-R | | 8 | 16 | 14 | 14 | 14 | 14 |
| | ODA | | | | | | | |
| Acid anhydrides mol % | TAHQ | | 50 | 50 | 75 | 50 | 50 | 35 |
| | s-BPDA | | 50 | 30 | 25 | 50 | 30 | 65 |
| | PMDA | | | 20 | | | 20 | |
| Dielectric constant | (—) | Normal state | 3.39 | 3.43 | 3.39 | 3.45 | 3.45 | 3.55 |
| | | After water absorption | 3.56 | 3.56 | 3.44 | 3.61 | 3.55 | 3.58 |
| | Evaluation result | | ◉ | ◉ | ◉ | ◉ | ◉ | ◯ |
| Dielectric tangent | (—) | Normal state | 0.0029 | 0.0037 | 0.0037 | 0.0026 | 0.0037 | 0.0021 |
| | | After water absorption | 0.0052 | 0.0079 | 0.0081 | 0.0050 | 0.0082 | 0.0042 |
| | Evaluation result | | ◉ | ◯ | ◯ | ◉ | ◯ | ◉ |
| CTE | (ppm/K) | | 18 | 18 | 20 | 19 | 18 | 19 |
| | Evaluation result | | ◯ | ◯ | ◯ | ◯ | ◯ | ◯ |
| Water absorption rate | (wt %) | | 0.63 | 1.05 | 0.76 | 0.63 | 1.08 | 0.75 |
| | Evaluation result | | ◉ | ◯ | ◉ | ◉ | ◯ | ◉ |
| Flame retardancy | (—) | | — | ◯ | ◯ | ◯ | ◯ | ◯ |

| Names of components | | Example 7 | Example 8 | Example 9 | Example 10 | Example 11 |
|---|---|---|---|---|---|---|
| Diamines mol % | p-PDA | 86 | 86 | 92 | 100 | 100 |
| | TFMB | | | | | |
| | TPE-R | 14 | | 8 | | |
| | ODA | | 14 | | | |
| Acid anhydrides mol % | TAHQ | 20 | 50 | 35 | 35 | 50 |
| | s-BPDA | 80 | 50 | 65 | 65 | 50 |
| | PMDA | | | | | |

TABLE 1-continued

| | | | | | | | |
|---|---|---|---|---|---|---|---|
| Dielectric constant | (—) | Normal state | 3.59 | 3.48 | 3.55 | 3.70 | 3.62 |
| | | After water absorption | 3.65 | 3.56 | 3.60 | 3.80 | 3.55 |
| | | Evaluation result | ◯ | ◎ | ◯ | ◯ | ◯ |
| Dielectric tangent | (—) | Normal state | 0.0033 | 0.0029 | 0.0023 | 0.0024 | 0.0029 |
| | | After water absorption | 0.0054 | 0.0061 | 0.0039 | 0.0045 | 0.0053 |
| | | Evaluation result | ◯ | ◎ | ◎ | ◎ | ◎ |
| CTE | (ppm/K) | | 20 | 17 | 18 | 17 | 15 |
| | | Evaluation result | ◯ | ◎ | ◯ | ◎ | ◎ |
| Water absorption rate | (wt %) | | 0.85 | 0.78 | 0.78 | 0.90 | 0.87 |
| | | Evaluation result | ◎ | ◎ | ◎ | ◎ | ◎ |
| Flame retardancy | (—) | | — | ◯ | ◯ | ◯ | ◯ |

TABLE 2

| Names of components | | | Comparative Example 1 | Comparative Example 2 | Comparative Example 3 | Comparative Example 4 | Comparative Example 5 |
|---|---|---|---|---|---|---|---|
| Diamines mol % | p-PDA | | 100 | 100 | 86 | 86 | 86 |
| | TPE-R | | | | 14 | 14 | 14 |
| Acid anhydrides mol % | TAHQ | | | 100 | 100 | 90 | 10 |
| | s-BPDA | | 100 | | | 10 | 90 |
| | PMDA | | | | | | |
| Dielectric constant | (—) | Normal state | 3.67 | 3.44 | 3.39 | 3.53 | 3.53 |
| | | After water absorption | 3.83 | 3.71 | 3.58 | 3.67 | 3.75 |
| | | Evaluation result | ◯ | ◎ | ◎ | ◯ | ◯ |
| Dielectric tangent | (—) | Normal state | 0.0075 | 0.0050 | 0.0044 | 0.0045 | 0.0043 |
| | | After water absorption | 0.0157 | 0.0128 | 0.0115 | 0.0101 | 0.0076 |
| | | Evaluation result | X | X | X | X | X |
| CTE | (ppm/K) | | 15 | 11 | 14 | 17 | 15 |
| | | Evaluation result | ◎ | ◎ | ◎ | ◎ | ◎ |
| Water absorption rate | (wt %) | | 1.77 | 1.01 | 1.08 | 0.95 | 1.04 |
| | | Evaluation result | X | ◯ | ◯ | ◎ | ◯ |
| Flame retardancy | (—) | | — | ◯ | ◯ | ◯ | ◯ |

| Names of components | | | Comparative Example 6 | Comparative Example 7 | Comparative Example 8 | Comparative Example 9 | Comparative Example 10 |
|---|---|---|---|---|---|---|---|
| Diamines mol % | p-PDA | | 86 | 86 | 86 | 86 | 86 |
| | TPE-R | | 14 | 14 | 14 | 14 | 14 |
| Acid anhydrides mol % | TAHQ | | 5 | 2 | | 50 | |
| | s-BPDA | | 85 | 83 | 100 | | 50 |
| | PMDA | | 10 | 15 | | 50 | 50 |
| Dielectric constant | (—) | Normal state | 3.67 | 3.40 | 3.53 | 3.57 | 3.63 |
| | | After water absorption | 3.88 | 3.68 | 3.68 | 3.80 | 3.84 |
| | | Evaluation result | ◯ | ◎ | ◯ | ◯ | ◯ |
| Dielectric tangent | (—) | Normal state | 0.0041 | 0.0040 | 0.0056 | 0.0080 | 0.0075 |
| | | After water absorption | 0.0084 | 0.0088 | 0.0112 | 0.0181 | 0.0175 |
| | | Evaluation result | X | X | X | X | X |
| CTE | (ppm/K) | | 17 | 21 | 13 | 11 | 11 |
| | | Evaluation result | ◎ | ◯ | ◎ | ◎ | ◎ |
| Water absorption rate | (wt %) | | 0.72 | 1.25 | 1.39 | 1.50 | 1.77 |
| | | Evaluation result | ◎ | X | X | X | X |
| Flame retardancy | (—) | | — | ◯ | ◯ | ◯ | ◯ |

TABLE 3

| Names of components | | | Comparative Example 11 | Comparative Example 12 | Comparative Example 13 | Comparative Example 14 | Comparative Example 15 |
|---|---|---|---|---|---|---|---|
| Diamines mol % | p-PDA | | 86 | 70 | 75 | | |
| | TFMB | | | | 17 | | |
| | TPE-R | | | 30 | 8 | | |
| | ODA | | 14 | | | | 100 |
| | BAPP | | | | | 100 | |
| Acid anhydrides mol % | TAHQ | | 2 | 35 | 100 | | 35 |
| | s-BPDA | | 83 | 65 | | 100 | 65 |
| | PMDA | | 15 | | | | |
| Dielectric constant | (—) | Normal state | 3.51 | 3.45 | 3.35 | 2.97 | 3.28 |
| | | After water absorption | 3.70 | 3.55 | 3.46 | 3.09 | 3.50 |
| | Evaluation result | | ○ | ◎ | ◎ | ◎ | ◎ |
| Dielectric tangent | (—) | Normal state | 0.0046 | 0.0025 | 0.0043 | 0.0060 | 0.0024 |
| | | After water absorption | 0.0103 | 0.0061 | 0.0089 | 0.0085 | 0.0060 |
| | Evaluation result | | X | ◎ | X | X | ◎ |
| CTE | (ppm/K) | | 20 | 28 | 16 | 55 | 45 |
| | Evaluation result | | ○ | X | ◎ | X | X |
| Water absorption rate | (wt %) | | 1.43 | 0.90 | 0.89 | 0.62 | 1.20 |
| | Evaluation result | | X | ◎ | ◎ | ◎ | X |
| Flame retardancy | (—) | | — | ○ | ○ | Δ | ○ |

| Names of components | | | Comparative Example 16 | Comparative Example 17 | Comparative Example 18 | Comparative Example 19 | Comparative Example 20 |
|---|---|---|---|---|---|---|---|
| Diamines mol % | p-PDA | | | | | 90 | 90 |
| | TFMB | | | 100 | 100 | | |
| | TPE-R | | 100 | | | 10 | 10 |
| | ODA | | | | | | |
| | BAPP | | | | | | |
| Acid anhydrides mol % | TAHQ | | 35 | 35 | 20 | 5 | |
| | s-BPDA | | 65 | 65 | | 45 | 50 |
| | PMDA | | | | 80 | 50 | 50 |
| Dielectric constant | (—) | Normal state | 3.30 | 3.00 | 2.97 | 3.16 | 3.09 |
| | | After water absorption | 3.50 | 3.10 | 3.10 | 3.20 | 3.12 |
| | Evaluation result | | ◎ | ◎ | ◎ | ◎ | ◎ |
| Dielectric tangent | (—) | Normal state | 0.0030 | 0.0045 | 0.0087 | 0.0048 | 0.0072 |
| | | After water absorption | 0.0060 | 0.0070 | 0.0127 | 0.0101 | 0.0089 |
| | Evaluation result | | ◎ | X | X | X | X |
| CTE | (ppm/K) | | 50 | 20 | 11 | 17 | 17 |
| | Evaluation result | | X | ○ | ◎ | ◎ | ◎ |
| Water absorption rate | (wt %) | | 0.85 | 0.75 | 0.90 | 0.93 | 0.85 |
| | Evaluation result | | ◎ | ◎ | ◎ | ◎ | ◎ |
| Flame retardancy | (—) | | — | Δ | ○ | ○ | ○ |

As can be seen from the results of above-described Examples, the polyimide resins obtained by using the polyimide resin precursors of the present embodiment are low in dielectric constant and dielectric tangent, each exhibit a low linear expansion coefficient and a low water absorption rate, and further have excellent flame retardancy.

INDUSTRIAL APPLICABILITY

The polyimide resin precursor of the present invention has an industrial applicability as a copper clad laminated plate to be used for flexible printed wiring boards.

What is claimed is:

1. A polyimide resin precursor obtained by allowing a diamine component and a tetracarboxylic acid anhydride component to react with each other,
   wherein the tetracarboxylic acid anhydride component comprises
   15 to 80 mol % of p-Phenylene bis(trimellitate anhydride) (TAHQ) or Naphthalene-2,6-diyl bis(1,3-dioxo-1,3-dihydro-2-benzofuran-5-carboxylate)(N26DB) based on the whole of the tetracarboxylic acid anhydride component; and
   20 to 85 mol % of 3,4,3',4'-biphenyltetracarboxylic acid dianhydride(s-BPDA) based on the whole of the tetracarboxylic acid anhydride component; and
   wherein based on the whole of the tetracarboxylic acid anhydride component,
   (i) the total of the content of the TAHQ or N26DB and the content of the s-BPDA is 75 mol % or more, and
   wherein the diamine component comprises p-phenylenediamine and 2,2'-bis(trifluoromethyl)benzidine;
   wherein based on the whole of the diamine component, the content of p-phenylenediamine is 75 mol % or more and the content of 2,2'-bis(trifluoromethyl)benzidine is 17 mol % or more.

2. The polyimide resin precursor according to claim 1, wherein the diamine component further comprises at least one selected from the group consisting of 2,2'-dimethyl-4, 4'-diaminobiphenyl, 1,3-bis(3-aminophenoxy)benzene, 1,4- bis(3-aminophenoxy)benzene, 4,4'-diaminodiphenyl ether, 3,4'-diaminodiphenyl ether and 2,2-bis(4-aminophenoxyphenyl)propane.

3. A polyimide resin obtained by curing the polyimide resin precursor according to claim 1.

4. A metal clad laminate wherein the polyimide resin according to claim 3 is laminated on a metal foil.

5. A flexible printed wiring board formed by using the metal clad laminate according to claim 4.

* * * * *